United States Patent
Huang

(10) Patent No.: US 9,449,680 B2
(45) Date of Patent: Sep. 20, 2016

(54) WRITE ASSIST CIRCUIT AND MEMORY CELL

(71) Applicant: MediaTek Inc., Hsin-Chu (TW)

(72) Inventor: Shih-Huang Huang, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/692,126

(22) Filed: Apr. 21, 2015

(65) Prior Publication Data

US 2016/0196868 A1   Jul. 7, 2016

Related U.S. Application Data

(60) Provisional application No. 62/100,154, filed on Jan. 6, 2015.

(51) Int. Cl.
*G11C 5/06* (2006.01)
*G11C 11/419* (2006.01)

(52) U.S. Cl.
CPC .................... *G11C 11/419* (2013.01)

(58) Field of Classification Search
CPC . G11C 11/412; G11C 11/413; G11C 11/419; G11C 7/1096; G11C 7/12; G11C 5/147; G11C 7/00; G11C 7/04
USPC ....... 365/154, 189.011, 189.16, 194, 189.11, 365/203, 156, 189.09, 189.14, 189.15, 191, 365/204, 211
See application file for complete search history.

(56) References Cited

U.S. PATENT DOCUMENTS

| 7,379,347 | B1 | 5/2008 | Nautiyal |
| 2006/0109706 | A1 | 5/2006 | Joshi |
| 2007/0081407 | A1 | 4/2007 | Maki et al. |
| 2009/0116308 | A1 | 5/2009 | Van Winkelhoff et al. |
| 2009/0135661 | A1 | 5/2009 | Hold |
| 2013/0021864 | A1 | 1/2013 | Deng et al. |
| 2013/0176796 | A1* | 7/2013 | Tanabe .................. G11C 11/419 365/189.011 |

* cited by examiner

*Primary Examiner* — Thong Q Le
(74) *Attorney, Agent, or Firm* — McClure, Qualey & Rodack, LLP

(57) ABSTRACT

A write assist circuit capable of writing data to a memory cell with a bit line and a bit line bar is provided. The write assist circuit includes a clamping circuit, and first and second sense amplifiers. The clamping circuit is coupled to first and second nodes to prevent the voltage of the first and second nodes from being lower than a data-retention voltage. The first and second nodes are supplied with first and second voltage sources. The first and second sense amplifier are utilized to detect the voltage of the bit line or the bit line bar, amplify the voltage and pull down the voltage of one of the first or second node according to the data while the voltage of the other one of the first or second node is kept at a power supply voltage level.

21 Claims, 6 Drawing Sheets

WRITE ASSIST CIRCUIT AND MEMORY CELL

CROSS REFERENCE TO RELATED APPLICATIONS

This application claims the benefit of U.S. Provisional Application No. 62/100,154, filed Jan. 6, 2015, the entirety of which is incorporated by reference herein.

BACKGROUND OF THE INVENTION

1. Field of the Invention

The present inventive concept relates to static random access memory (SRAM) cells. More particularly, the inventive concept relates to a write assist circuit for operating memory cells.

2. Description of the Related Art

More and more electronic devices demand memory devices and memory cells capable of operating at high speed. Memory devices perform or execute different operations (e.g., read operations, write operations and erase operations) to store data, retrieve stored data, and maintain or manage stored data. Each of these operations requires a certain amount of execution time or "cycle time" to be performed within the memory device which includes a plurality of memory cells. However, the write operation cycle time (i.e., the period of time required to perform a write operation) most directly affects or determines the maximum speed at which a memory device may operate.

Generally, a memory cell is biased by a voltage source and includes at least two PG (pull-gate) transistors and at least two PU (pull-up) transistors. When data is written to a memory cell, one of the PG transistors is turned on to pull down the high voltage node (which is supplied by the voltage source) of the corresponding PU transistor. In other words, the high node connected to the voltage source would collapse. However, if the high voltage nodes of the other PU transistors collapse at the same time, a write failure may occur. In addition, it may need a longer cycle time due to the write failure and for the data to be read from the memory cell. In order to reduce the cycle time of a memory device, a write assist circuit for writing data to a memory cell with a high operation speed is therefore required.

BRIEF SUMMARY OF THE INVENTION

Certain embodiments of the present inventive concept provide SRAM cells that functionally incorporate write assist circuitry, yet are capable of operating at high speed.

In one embodiment, the present invention provides a write assist circuit capable of writing data to a memory cell with a bit line and a bit line bar. The write assist circuit includes a clamping circuit, a first coupling circuit and a second coupling circuit. The clamping circuit is coupled to a first node and a second node to prevent the voltage of the first node and the second node from being lower than a data-retention voltage. The second node is different from the first node. The first node and the second node are supplied with a first voltage source and a second voltage source different from the first voltage source, and the memory cell is supplied by the first voltage source at the first node and the second voltage source at the second node respectively. The first coupling circuit is connected between the first node and the bit line. The second coupling circuit is connected between the second node and the bit line bar. When the data is written to the memory cell, either the first coupling circuit or the second coupling circuit is utilized to pull down a voltage of one of the first node or the second node according to the data while a voltage of the other one of the first node or the second node is kept at a power supply voltage level.

In another embodiment, the present invention provides a write assist circuit capable of writing data to a memory cell with a bit line and a bit line bar. The write assist circuit includes a clamping circuit, a first sense amplifier and a second sense amplifier. The clamping circuit is coupled to a first node and a second node to prevent the voltage of the first node and the second node from being lower than the data-retention voltage. The second node is different from the first node. The first node and the second node are supplied with a first voltage source and a second voltage source different from the first voltage source, and the memory cell is supplied by the first voltage source at the first node and the second voltage source at the second node respectively. The second sense amplifier is different from the first sense amplifier. The first sense amplifier and the second sense amplifier are utilized to detect a voltage of the bit line or the bit line bar, amplify the voltage and pull down the voltage of one of the first node or the second node according to the data while a voltage of the other one of the first node or the second node is kept at a power supply voltage level.

In another embodiment, the present invention provides a memory cell capable of being written by data with a bit line and a bit line bar. The memory cell includes a first PMOS transistor, a second PMOS transistor, a first NMOS transistor, a second NMOS transistor, a third NMOS transistor and a fourth NMOS transistor. The first PMOS transistor and the second PMOS transistor respectively have drains supplied by a first voltage source at a first node and a second voltage source at a second node, sources coupled to a left node and a right node, and gates coupled to the right node and the left node. The second voltage source and the first voltage source are different and they are pre-charged to a power supply voltage level. A voltage of one of the first node or the second node is pulled down according to the data while a voltage of the other one of the first node or the second node is kept at the power supply voltage level by utilizing a write assist circuit to couple and/or amplify the voltage of the first node or the second node. The first NMOS transistor and the second NMOS transistor respectively have gates coupled to the right node and the left node, drains coupled to the left node and the right node, and sources coupled to a ground terminal. The third NMOS transistor is coupled between the left node and a bit line, and has a gate coupled to a word line. The fourth NMOS transistor is coupled between the right node and a bit line bar, and has a gate coupled to the word line.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following description is of the best-contemplated operation of carrying out the invention. This description is made for the purpose of illustrating the general principles of the invention and should not be taken in a limiting sense. Certain terms and figures are used throughout the description and following claims to refer to particular components. As one skilled in the art will appreciate, manufacturers may refer to a component by different names. This document does not intend to distinguish between components that differ in name but not function. The terms "component", "system" and "device" used in the present invention could be the entity relating to the computer which is hardware, software, or a combination of hardware and software. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The invention provides a write assist circuit for writing data to a memory cell. A memory cell array includes a plurality of memory cells which are coupled between a bit line and a bit bar line. At least one memory cell stores a data bit. The memory cells may be SRAM cells, read only memory (ROM) cells or any other memory cells.

Figure 1:
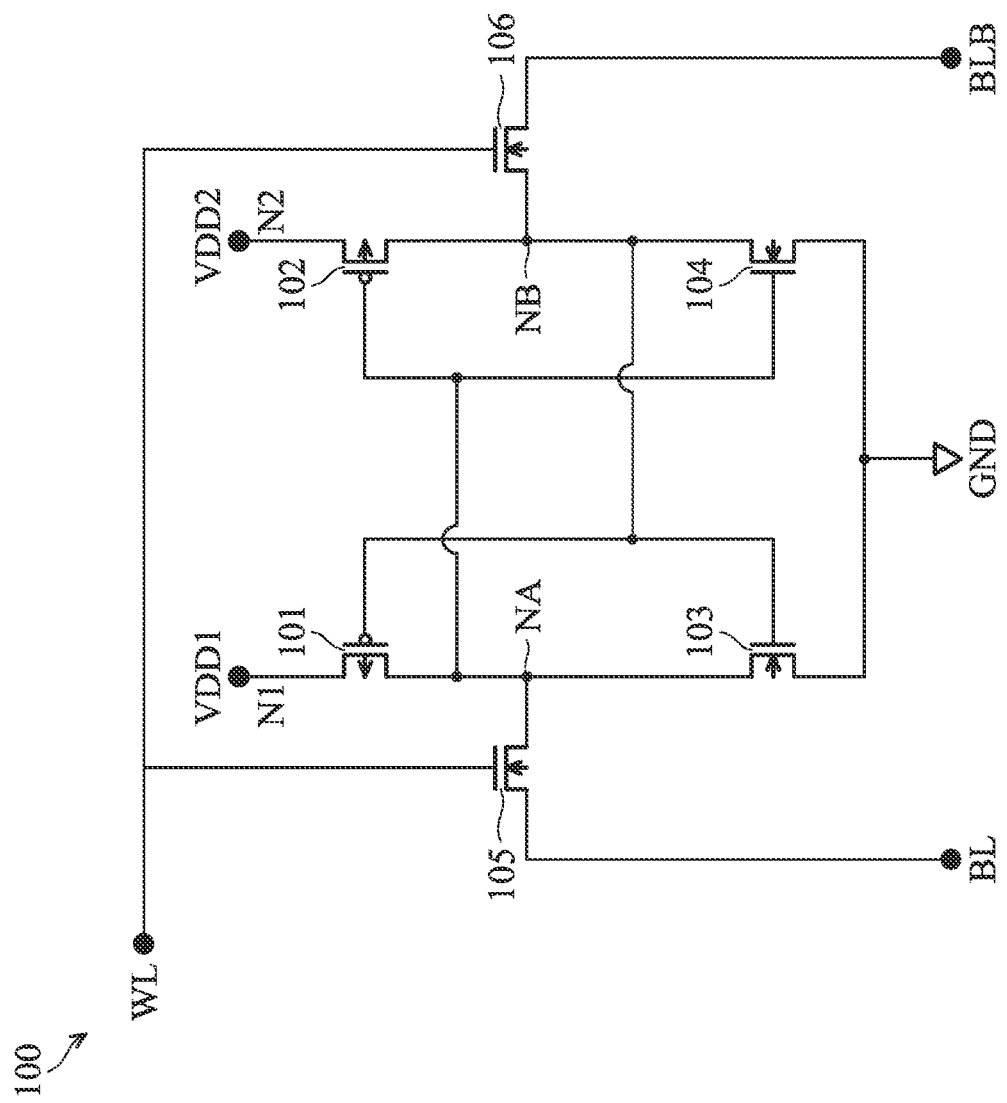
FIG. 1 is a schematic diagram of an SRAM cell according to the present invention.

Referring to FIG. 1, a circuit diagram of a static random access memory (SRAM) cell 100 according to the invention is shown. The SRAM cell 100 includes two P-type metal oxide semiconductor (PMOS) transistors 101 and 102 and a plurality of N-type metal oxide semiconductor (NMOS) transistors 103~106. A core circuit of the memory cell 100 includes the PMOS transistors 101, 102 (PU transistors) and the NMOS transistors 105, 106 (PG transistors) and stores a data bit. The PMOS transistor 101 (the first PMOS transistor) is coupled between a node N1 (the first node) which is supplied with a first voltage source VDD1 and a node NA (the left node), and the PMOS transistor 102 (the second PMOS transistor) is coupled between a node N2 (the second node) which is supplied with a second voltage source VDD2 and a node NB (the right node). In one embodiment, the PMOS transistors 101 and 102 respectively have drains connected to the nodes N1 and N2, sources coupled to the node NA and the node NB, and gates coupled to the node NB and the node NA.

It should be noted that the second voltage source VDD2 and the first voltage source VDD1 are different and they are pre-charged to a power supply voltage level. Specifically, the first voltage source VDD1 and the second voltage source VDD2 are separated and independent with each other, however, they could be charged to the same voltage level. Therefore, a voltage of one of the node N1 or the node N2 is pulled down according to the data while a voltage of the other one of the node N1 or the node N2 is kept at the power supply voltage level. Furthermore, in one embodiment, the NMOS transistor 103 (the first NMOS transistor) and the NMOS transistor 104 (the second NMOS transistor) respectively have gates coupled to the node NB and the node NA, drains coupled to the node NA and the node NB, and sources coupled to the ground terminal GND. In addition, the NMOS transistor 105 (the third NMOS transistor) is coupled between the node NA and a bit line BL, and having a gate coupled to a word line WL. The NMOS transistor 106 (the fourth NMOS transistor) is coupled between the node NB and a bit line bar BLB and has a gate coupled to the word line WL.

When a data bit 0 is to be written or stored to the SRAM cell 100, a bit line BL can have a logic low voltage, and a bit line bar BLB can have a logic high voltage. A word line WL can then be enabled to turn on the NMOS transistors 105 and 106, respectively coupling the bit line BL and the bit line bar BLB to the nodes NA and NB. The voltage of the node NA is therefore lowered toward a logic low voltage of the bit line BL, and the voltage of the node NB is raised toward a logic high voltage of the bit line bar BLB. However, since the voltage of the node NA is lowered toward the logic low voltage of the bit line BL, the voltage of the node N1 which is originally bias by the voltage source VDD1 would be pulled down. Nevertheless, the voltage of the node N2 which is biased by the voltage source VDD2 is still kept at the power supply voltage level.

Figure 2:
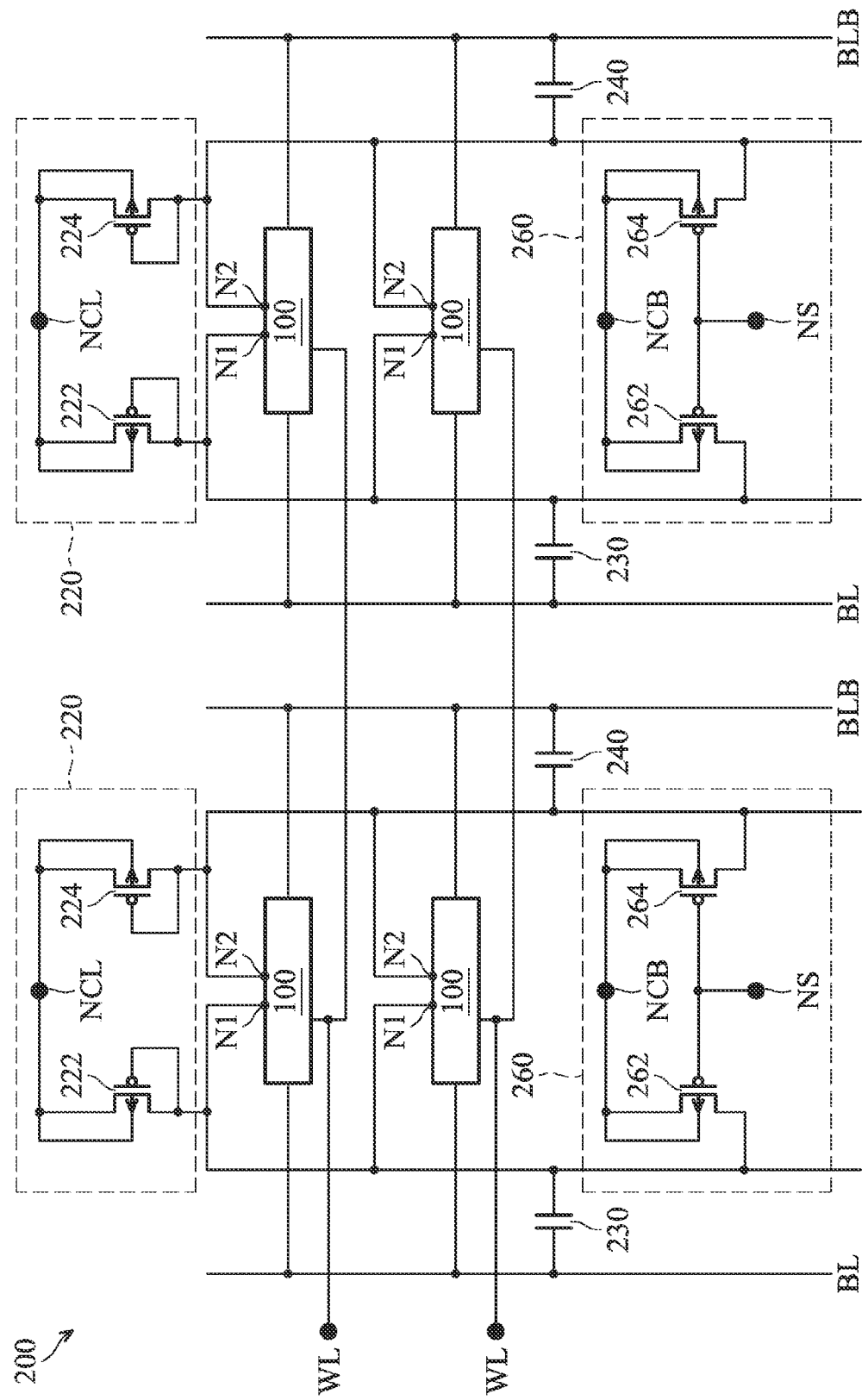
FIG. 2 is a schematic diagram of a memory device according to the present invention.

On the other hand, when a data bit 1 is to be written or stored to the SRAM cell 100, the bit line BL can have a logic high voltage, and the bit line bar BLB can have a logic low voltage. The word line WL can then be enabled to turn on the NMOS transistors 105 and 106, respectively coupling the bit line BL and the bit line bar BLB to the nodes NA and NB. The voltage of the node NA is therefore raised toward a logic high voltage of the bit line BL, and the voltage of the node NB is lowered toward a logic low voltage of the bit line bar BLB. Since the voltage of the node NB is lowered toward the logic low voltage of the bit line bar BLB, the voltage of the node N2 which is originally bias by the voltage source VDD2 would be pulled down. However, the voltage of the node N1 which is biased by the voltage source VDD1 is still kept at the power supply voltage level. As such, by utilizing the SRAM cell 100 as illustrated in FIG. 2, only the voltage of one of the node N1 or the node N2 would be pulled down according the write data while the voltage of the other node N1 or N2 is still kept at the power supply voltage level. Therefore, the SRAM cell 100 supplied by two independent voltages sources VDD1 and VDD2 could overcome the problem of write failure. In addition, because one voltage of the node N1 or N2 is kept at the power supply voltage level, the data stored in the SRAM cell 100 could be read out rapidly to improve the cycle time of operating the memory device.

FIG. 2 is a schematic diagram of a memory device 200 according to the present invention. As shown in FIG. 2, the memory device 200 includes at least one SRAM cell 100, a word line WL, and a write assist circuit. The write assist circuit includes a clamping circuit 220, a first coupling circuit 230, a second coupling circuit 240 and a pre-charge circuit 260. In one embodiment, the clamping circuit 220 is coupled to the node N1 and the node N2 to prevent the voltages of the nodes N1 and N2 from being lower than a data-retention voltage. Specifically, when the data bit is going to be written to a selected SRAM cell by enabling its corresponding word line and bit line, the un-selected SRAM cells next to the selected SRAM cell could also be affected and could lose the stored data. Therefore, with the arrangement of the clamping circuit 220, the data written to the SRAM cell 100 could be stored stably and reliably.

In one embodiment, as shown in FIG. 2, the clamping circuit includes a PMOS transistor 222 (the first clamping PMOS transistor) and a PMOS transistor 224 (the second clamping PMOS transistor). The PMOS transistor 222 has a source coupled to the node N1, a gate connected to the source, a drain coupled to a clamping bias node NCL and a bulk connected the drain. In addition, the PMOS transistor 224 has a source coupled to the node N2, a gate connected to the source, a drain coupled to the clamping bias node NCL and a bulk connected the drain. The clamping bias node NCL could be supplied by a voltage source, for example, the first voltage source VDD1, the second voltage source VDD2 or another voltage source. In one embodiment, the gate and source of the PMOS transistor 222 are directly connected to the node N1, and the gate and source of the PMOS transistor 224 are directly connected to the node N2.

Furthermore, a first coupling circuit 230 is arranged between the node N1 and the bit line BL, and a second coupling circuit 240 is arranged between the node N2 and the bit line bar BLB. Specifically, as shown in FIG. 2, the first coupling circuit 230 is directly connected between the node N1 and the bit line BL, and the second coupling circuit 240 is directly connected between the node N2 and the bit line bar BLB. When the data is written to the memory cell, either the first coupling circuit 230 or the second coupling circuit 240 is utilized to couple and pull down a voltage of one of the nodes N1 and N2 according to the data while the voltage of the other one of the nodes N1 and N2 is kept at the power supply voltage level. For example, when a data bit 0 is written to the SRAM cell 100, the bit line BL would have a logic low voltage. Afterwards, the first coupling circuit 230 couples the logic low voltage of the bit line BL to the node N1. Therefore, the voltage of the node N1 would be pulled down, and the voltage of the node N2 remains the same. When a data bit 1 is written to the SRAM cell 100, the bit line bar BLB would have a logic low voltage. Afterwards, the second coupling circuit 240 couples the logic low voltage of the bit line bar BLB to the node N2. Therefore, the voltage of the node N2 would be pulled down, and the voltage of the node N1 remains the same. In one embodiment, the first coupling circuit 230 and the second coupling circuit 240 are capacitors. Specifically, the first coupling circuit 230 and the second coupling circuit 240 are parasitic capacitors within the memory device 200.

In addition, the write assist circuit further includes a pre-charge circuit 260 which is utilized to pre-charge the first voltage source VDD1 and the second voltage source VDD2 to the power supply voltage level. As shown in FIG. 2, the pre-charge circuit 240 includes a PMOS transistor 262 (the first charge PMOS transistor) and a PMOS transistor 264 (the second charge PMOS transistor). The PMOS transistor 262 has a source coupled to the node N1, a gate coupled to a selection node NS, a drain coupled to a charge bias node NCB and a bulk connected the drain. The PMOS transistor 264 has a source coupled to the node N2, a gate coupled to the selection node NS, a drain coupled to the charge bias node NCB and a bulk connected the drain. In one embodiment, the source of the PMOS transistor 262 is directly connected to the node N1, and the source of the PMOS transistor 264 is directly connected to the node N2. The charge bias node NCB could be supplied by a voltage source, for example, the first voltage source VDD1, the second voltage source VDD2 or another voltage source.

Figure 3A:
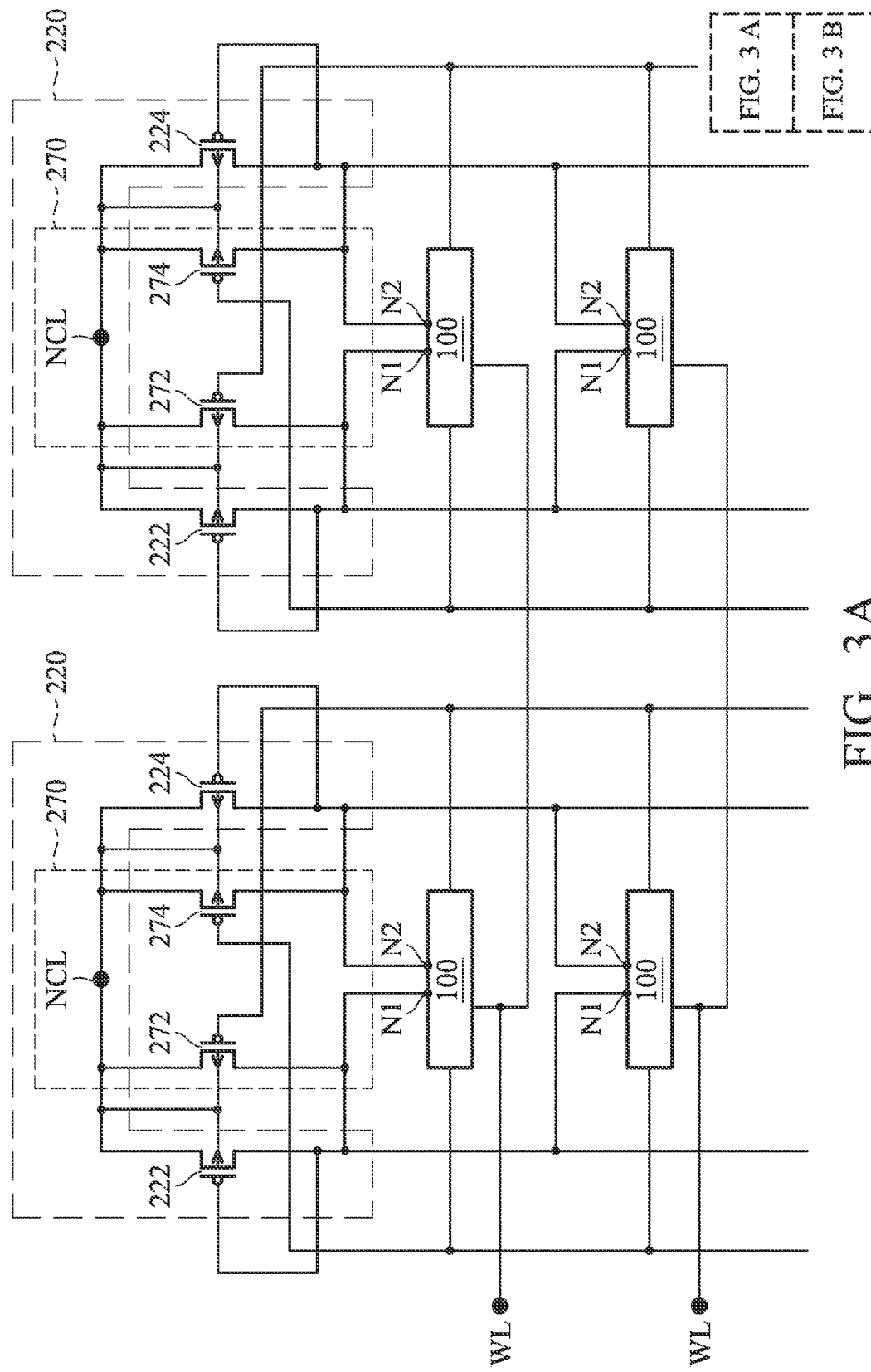
FIGS. 3A&3B are schematic diagrams of a memory device according to the present invention.
Figure 3B:
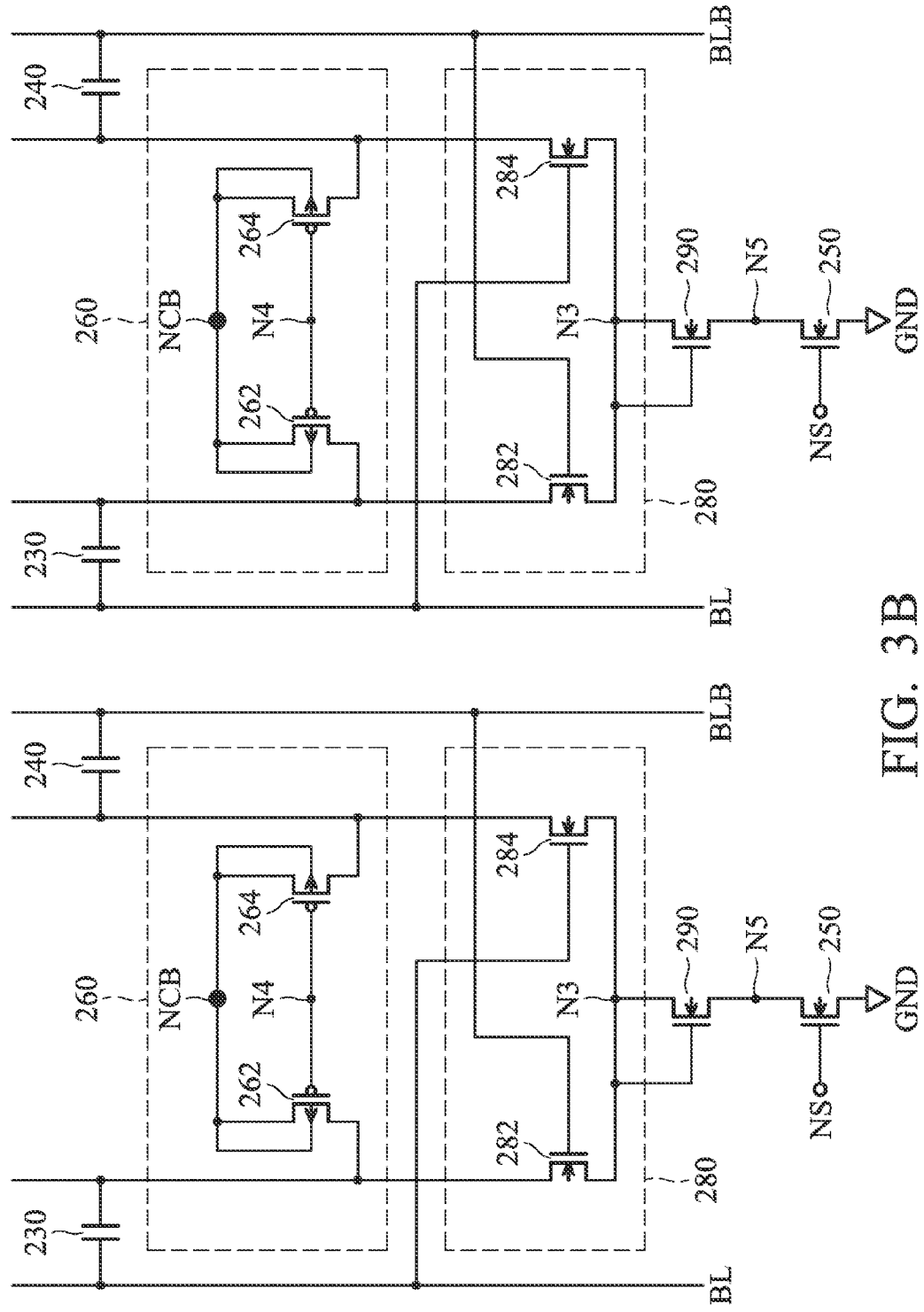

FIGS. 3A&3B are schematic diagrams of a memory device 200 according to the present invention. As shown in FIG. 3, the memory device 200 includes at least one SRAM cell 100, a word line WL, and a write assist circuit. The write assist circuit includes a clamping circuit 220, a first coupling circuit 230, a second coupling circuit 240, a selection circuit 250, a pre-charge circuit 260, a first sense amplifier 270, a second sense amplifier 280 and a gated NMOS transistor 290. In one embodiment, the first sense amplifier 270 and the second sense amplifier 280 are utilized to detect a voltage of the bit line BL or the bit line bar BLB, amplify the voltage and pull down a voltage of one of the nodes N1 and N2 according to the data while a voltage of the other one of the nodes N1 and N2 is kept at the power supply voltage level which is provided by the pre-charge circuit 260.

For example, when a data bit 0 is written to the SRAM cell 100, a bit line BL can have a logic low voltage, and a bit line bar BLB can have a logic high voltage. Afterwards, the first sense amplifier 270 and the second sense amplifier 280 detect the logic low voltage and/or the logic high voltage, amplify the above voltage, and pull down the voltage of the node N1 while the voltage of the node N2 is kept at the power supply voltage level. In addition, when a data bit 1 is written to the SRAM cell 100, a bit line BL can have a logic high voltage, and a bit line bar BLB can have a logic low voltage. Afterwards, the first sense amplifier 270 and the second sense amplifier 280 detect the logic low voltage and/or the logic high voltage, amplify the above voltage, and pull down the voltage of the node N2 while the voltage of the node N1 is kept at the power supply voltage level. Since only one voltage of the node N1 or the node N2 would be pulled down according the write data while the other voltage of the node N1 or N2 is still kept at the power supply voltage level, the write assist circuit could overcome the problem of write failure and improve the operation speed of the SRAM cell 100.

In one embodiment, the first sense amplifier includes a PMOS transistor 272 (the first amplifier PMOS transistor) and a PMOS transistor 274 (the second amplifier PMOS transistor). The PMOS transistor 272 has a source coupled to the node N1, a gate coupled to the bit line bar BLB, a drain coupled to the clamping bias node NCL and a bulk coupled to the clamping bias node NCL. In addition, the PMOS transistor 274 has a source coupled to the node N2, a gate coupled to the bit line BL, a drain coupled to the clamping bias node NCL and a bulk coupled to the clamping bias node NCL. Specifically, the source of the PMOS transistor 272 is directly connected to the node N1, the gate of the PMOS transistor 272 is directly connected to the bit line bar BLB, the source of the PMOS transistor 274 is directly connected to the node N2, and the gate of the PMOS transistor 274 is directly connected to the bit line BL. In another embodiment, the second sense amplifier 280 includes a NMOS transistor 282 (the first amplifier NMOS transistor) and a NMOS transistor 284 (the first amplifier NMOS transistor). The NMOS transistor 282 has a drain coupled to the node N1, a gate coupled to the bit line bar BLB, a source coupled to a third node N3. Furthermore, the NMOS transistor 284 has a drain coupled to the node N2, a gate coupled to the bit line BL and a source coupled to the third node N3. In one embodiment, the drain of the NMOS transistor 282 is directly connected to the node N1, the gate of the NMOS transistor 282 is directly connected the bit line bar BLB, the drain of the NMOS transistor 284 is directly connected to the node N2, the gate of the NMOS transistor 282 is directly connected the bit line BL.

Specifically, the first sense amplifier 270 and the second sense amplifier 280 are cross-coupled devices. The first sense amplifier 270 is utilized to pull down and clamp the voltage of node N1 or N2 to a voltage level which approximately equals to the power source voltage level minus the threshold voltage of the two PMOS transistors 272 and 274. The second sense amplifier 280 is utilized to pull down and clamp the voltage of node N1 or N2 to a voltage level which approximately equals to the threshold voltage of the two NMOS transistors 282 and 284. Accordingly, the first sense amplifier 270 and the second sense amplifier 280 could clamp the voltage of node N1 or N2 to a level which is between the threshold voltage of the two NMOS transistors 282 and 284 and the power source voltage level minus the threshold voltage of the two PMOS transistors 272 and 274.

In addition, the write assist circuit further includes a pre-charge circuit 260 which is utilized to pre-charge the first voltage source VDD1 and the second voltage source VDD2 to the power supply voltage level. As shown in FIG. 3, the pre-charge circuit 240 includes a PMOS transistor 262 and a PMOS transistor 264. The PMOS transistor 262 has a source coupled to the node N1, a gate coupled to the node N4, a drain coupled to a charge bias node NCB and a bulk connected the drain. The PMOS transistor 264 has a source coupled to the node N2, a gate coupled to the node N4, a drain coupled to the charge bias node NCB and a bulk connected the drain. For example, the charge bias node NCB could be supplied by a voltage source, for example, the first voltage source VDD1, the second voltage source VDD2 or another voltage source.

In one embodiment, the gated NMOS transistor 290 has a gate and a drain coupled to the node N3, and a source coupled to the node N5 (the fifth node) different from the node N3. The gated NMOS transistor 290 could be utilized to clamp the voltage of the node N1 or the node N2. Furthermore, the selection circuit 250 is coupled to the gated NMOS transistor 290 to enable the first sense amplifier 270 and the second sense amplifier 280. As shown in FIG. 3, the selection circuit 250 includes a NMOS transistor having a gate coupled to a selection bias node NS, a drain coupled to the node N5 and a source coupled to a ground terminal GND. It should be noted that the selection circuit 250 could be triggered by the selection node NS to enable the first sense amplifier 270 and the second sense amplifier 280 which is in the same column with the triggered selection circuit 250. In other words, other first sense amplifiers 270 and second sense amplifiers 280 which are not in the same column with the triggered selection circuit 250 would not be enabled. Therefore, the memory device 200 could be operated more effectively and save more power.

The clamping circuit 220, the first coupling circuit 230 and the second coupling circuit 240 have been illustrated in FIG. 2 and will not be repeated again. However, it should be noted that the first and second sense amplifiers 270 & 280 and the first and second coupling circuits 230 & 240 are both utilized to assist the write operation for the SRAM cell 200. The first sense amplifiers 270 and the second sense amplifiers 280 make contributions to the memory device 200 when the coupling effects of the first coupling circuit 230 and the second coupling circuit 240 are not strong or obvious. Furthermore, in one embodiment, the memory device 200 includes the first sense amplifier 270 but does not include the second sense amplifier 280, and the voltage of the node N1 or N2 is clamped toward the voltage level which is approximately equal to the power source voltage level minus the threshold voltage of the two PMOS transistors 272 and 274. In another embodiment, the memory device 200 includes the second sense amplifier 280 but does not include the first sense amplifier 270, and the voltage of the node N1 or N2 is clamped toward the voltage level which is approximately equal to the threshold voltage of the two NMOS transistors 282 and 284.

Figure 4A:
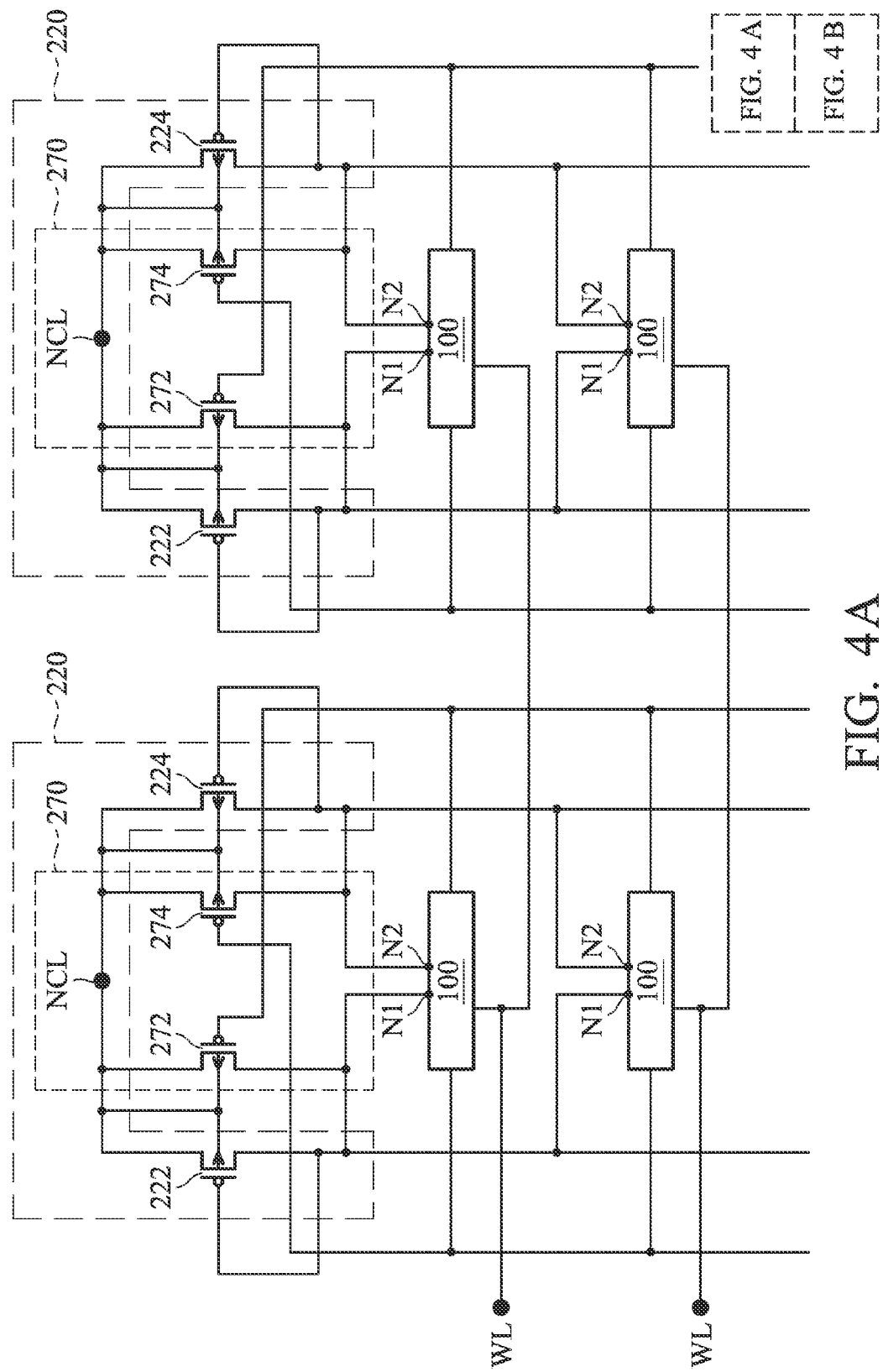
FIGS. 4A&4B are other schematic diagrams of a memory device according to the present invention.
Figure 4B:
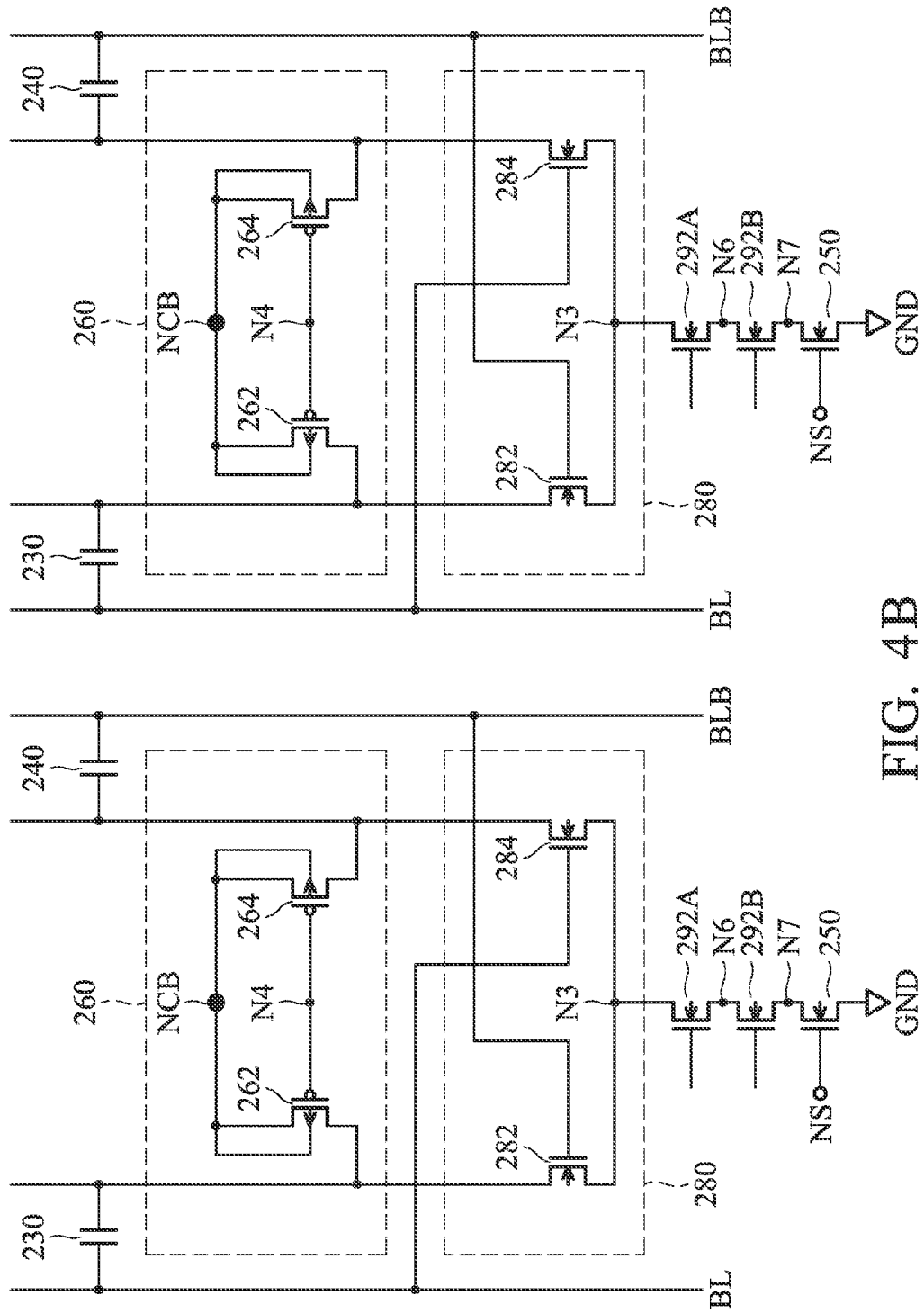

FIGS. 4A&4B are schematic diagrams of a memory device 200 according to the present invention. Compared to the circuit diagram as shown in FIGS. 3A&3B, the memory device 200 shown in FIG. 4 further includes an NMOS transistor 292A (the first auto-clamp NMOS transistor) and an NMOS transistor 292B (the second auto-clamp NMOS transistor), but does not include the gated NMOS transistor 290. The NMOS transistor 292A has a gate coupled to the node N1, a drain coupled to the node N3 and a source coupled to the node N6 (the sixth node) different from the node N3. The NMOS transistor 292B has a gate coupled to the node N2, a drain coupled to the node N6 and a source coupled to the node N7 (the seventh node) different from the node N6. The NMOS transistors 292A and 292B are connected in series. Since the gates of the NMOS transistors 292A and 292B are connected to the voltage sources VDD1 and VDD2, they could be utilized to automatically clamp the voltage of the node N1 or the node N2. Furthermore, the clamping speed of the NMOS transistors 292A and 292B is faster than that of the gated NMOS transistor 290. In addition, the clamping circuit 220, the first coupling circuit 230, the second coupling circuit 240, the selection circuit 250, the pre-charge circuit 260, the first sense amplifier 270 and the second sense amplifier 280 have been illustrated in FIG. 3 and will not be repeated again.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A write assist circuit, capable of writing data to a memory cell with a bit line and a bit line bar, comprising:
 a clamping circuit, coupled to a first node and a second node to prevent the voltage of the first node and the second node from being lower than a data-retention voltage, wherein the second node is different from the first node, the first node and the second node are supplied with a first voltage source and a second voltage source different from the first voltage source, and the memory cell is supplied by the first voltage source at the first node and the second voltage source at the second node respectively;
 a first coupling circuit, connected between the first node and the bit line; and a second coupling circuit, connected between the second node and the bit line bar, wherein when the data is written to the memory cell, one of the first coupling circuit and the second coupling circuit is utilized to pull down a voltage of one of the first node or the second node according to the data while a voltage of the other one of the first node or the second node is kept at a power supply voltage level.

2. The write assist circuit as claimed in claim 1, wherein the clamping circuit comprises:
a first clamping PMOS transistor, having a source coupled to the first node, a gate connected to the source, a drain coupled to a clamping bias node and a bulk connected the drain; and
a second clamping PMOS transistor, having a source coupled to the second node, a gate connected to the source, a drain coupled to the clamping bias node and a bulk connected the drain.

3. The write assist circuit as claimed in claim 1, wherein the write assist circuit further comprises a pre-charge circuit, utilized to pre-charge the first voltage source and the second voltage source to the power supply voltage level.

4. The write assist circuit as claimed in claim 3, wherein the pre-charge circuit comprises:
a first charge PMOS transistor, having a source coupled to the first node, a gate coupled to a selection node, a drain coupled to a charge bias node and a bulk connected the drain; and
a second charge PMOS transistor, having a source coupled to the second node, a gate coupled to the selection node, a drain coupled to the charge bias node and a bulk connected the drain.

5. The write assist circuit as claimed in claim 1, wherein the first coupling circuit and the second coupling circuit are capacitors.

6. A write assist circuit, capable of writing data to a memory cell with a bit line and a bit line bar, comprising:
a clamping circuit, coupled to a first node and a second node to prevent the voltage of the first node and the second node from being lower than a data-retention voltage, wherein the second node is different from the first node, the first node and the second node are supplied with a first voltage source and a second voltage source different from the first voltage source, and the memory cell is supplied by the first voltage source at the first node and the second voltage source at the second node respectively; and
a first sense amplifier and a second sense amplifier different from the first sense amplifier, wherein the first sense amplifier and the second sense amplifier are utilized to detect a voltage of the bit line or the bit line bar, amplify the voltage and pull down a voltage of one of the first node or the second node according to the data while a voltage of the other one of the first node or the second node is kept at a power supply voltage level.

7. The write assist circuit as claimed in claim 6, wherein the clamping circuit comprises:
a first clamping PMOS transistor, having a source coupled to the first node, a gate connected to the source, a drain coupled to a clamping bias node and a bulk coupled to the clamping bias node; and
a second clamping PMOS transistor, having a source coupled to the second node, a gate connected to the source, a drain coupled to a clamping bias node and a bulk coupled to the clamping bias node.

8. The write assist circuit as claimed in claim 7, wherein the first sense amplifier comprises:
a first amplifier PMOS transistor, having a source coupled to the first node, a gate coupled to the bit line bar, a drain coupled to the clamping bias node and a bulk coupled to the clamping bias node; and
a second amplifier PMOS transistor, having a source coupled to the second node, a gate coupled to the bit line, a drain coupled to the clamping bias node and a bulk coupled to the clamping bias node.

9. The write assist circuit as claimed in claim 6, wherein the second sense amplifier comprises:
a first amplifier NMOS transistor, having a drain coupled to the first node, a gate coupled to the bit line bar, a source coupled to a third node; and
a second amplifier NMOS transistor, having a drain coupled to the second node, a gate coupled to the bit line, a source coupled to the third node.

10. The write assist circuit as claimed in claim 6, wherein the write assist circuit further comprises a pre-charge circuit to pre-charge the first voltage source and the second voltage source to the power supply voltage level.

11. The write assist circuit as claimed in claim 10, wherein the pre-charge circuit comprises:
a first charge PMOS transistor, having a source coupled to the first node, a gate coupled to a fourth node, a drain coupled to a charge bias node and a bulk connected the drain; and
a second charge PMOS transistor, having a source coupled to the second node, a gate coupled to the fourth node, a drain coupled to the charge bias node and a bulk connected the drain.

12. The write assist circuit as claimed in claim 10, wherein the write assist circuit further comprises a first capacitor and a second capacitor, wherein the first capacitor is arranged between the first node and the bit line, and the second capacitor is arranged between the second node and the bit line bar, wherein when the data is written to the memory cell, one of the first capacitor and the second capacitor is utilized to pull down a voltage of one of the first node or the second node according to the data while a voltage of the other one of the first node or the second node is kept at the power supply voltage level.

13. The write assist circuit as claimed in claim 9, wherein the write assist circuit further comprises a gated NMOS transistor having a gate coupled to the third node, a drain coupled to the third node and a source coupled to a fifth node different from the third node.

14. The write assist circuit as claimed in claim 13, wherein the write assist circuit further comprises a selection circuit to enable the first sense amplifier and the second sense amplifier.

15. The write assist circuit as claimed in claim 14, wherein the selection circuit comprises a NMOS transistor having a gate coupled to a selection bias node, a drain coupled to the fifth node and a source coupled to a ground terminal.

16. The write assist circuit as claimed in claim 9, wherein the write assist circuit further comprises:
a first auto-clamp NMOS transistor having a gate coupled to the first node, a drain coupled to the third node and a source coupled to a sixth node different from the third node; and
a second auto-clamp NMOS transistor having a gate coupled to the second node, a drain coupled to the sixth node and a source coupled to a seventh node different from the sixth node.

17. The write assist circuit as claimed in claim 16, wherein the write assist circuit further comprises a selection circuit to enable the first sense amplifier and the second sense amplifier.

18. The write assist circuit as claimed in claim 17, wherein the selection circuit comprises a NMOS transistor having a gate coupled to a selection bias node, a drain coupled to the seventh node and a source coupled to a ground terminal.

19. A memory cell, capable of being written by data with a bit line and a bit line bar, comprising:
- a first PMOS transistor and a second PMOS transistor, respectively having drains supplied by a first voltage source at a first node and supplied by a second voltage source at a second node, sources coupled to a left node and a right node, and gates coupled to the right node and the left node;
- a first NMOS transistor and a second NMOS transistor, respectively having gates coupled to the right node and the left node, drains coupled to the left node and the right node, and sources coupled to a ground terminal;
- a third NMOS transistor, coupled between the left node and a bit line, and having a gate coupled to a word line; and
- a fourth NMOS transistor, coupled between the right node and a bit line bar, and having a gate coupled to the word line, wherein the second voltage source and the first voltage source are pre-charged to a power supply voltage level and they are different, and a voltage of one of the first node or the second node is pulled down according to the data while a voltage of the other one of the first node or the second node is kept at the power supply voltage level by utilizing a write assist circuit to couple and/or amplify the voltage of the first node or the second node.

20. The memory cell as claimed in claim 19, wherein the write assist circuit comprises a clamping circuit, a first sense amplifier and a second sense amplifier, wherein:
- the clamping circuit is coupled to the first node and the second node to prevent the voltage of the first node and the second node from being lower than a data-retention voltage, the first node and the second node are different and supplied with the first voltage source and the second voltage source respectively, the memory cell connects to the first node and the second node respectively; and
- the first sense amplifier and the second sense amplifier are utilized to detect a voltage of the bit line or the bit line bar, amplify the voltage and pull down the voltage of one of the first node or the second node according to the data while the voltage of the other one of the first node or the second node is kept at the power supply voltage level.

21. The memory cell as claimed in claim 19, wherein the write assist circuit comprises a clamping circuit, a first coupling circuit and a second coupling circuit, wherein:
- the clamping circuit is coupled to the first node and the second node to prevent the voltage of the first node and the second node from being lower than a data-retention voltage, wherein the second node is different from the first node, the first node and the second node are supplied with the first voltage source and the second voltage source, and the memory cell connects to the first node and the second node respectively;
- the first coupling circuit is arranged between the first node and the bit line; and
- the second coupling circuit is arranged between the second node and the bit line bar, when the data is written to the memory cell, one of the first coupling circuit and the second coupling circuit is utilized to pull down the voltage of one of the first node or the second node according to the data while the voltage of the other one of the first node or the second node is kept at a power supply voltage level.

* * * * *